(12) United States Patent
Han

(10) Patent No.: US 8,274,080 B2
(45) Date of Patent: Sep. 25, 2012

(54) SEMICONDUCTOR WAFER INCLUDING GUARD RING PATTERNS AND PROCESS MONITORING PATTERNS

(75) Inventor: Dong-Hyun Han, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 349 days.

(21) Appl. No.: 12/588,437

(22) Filed: Oct. 15, 2009

(65) Prior Publication Data

US 2010/0102317 A1    Apr. 29, 2010

(30) Foreign Application Priority Data

Oct. 24, 2008   (KR) .................. 10-2008-0104952

(51) Int. Cl.
| | | |
|---|---|---|
| H01L 23/58 | (2006.01) |
| H01L 29/10 | (2006.01) |
| H01L 29/423 | (2006.01) |
| H01L 29/74 | (2006.01) |
| H01L 31/111 | (2006.01) |
| H01L 29/68 | (2006.01) |
| H01L 29/76 | (2006.01) |
| H01L 31/062 | (2012.01) |
| H01L 31/113 | (2006.01) |
| H01L 31/119 | (2006.01) |
| H01L 31/00 | (2006.01) |
| H01L 29/861 | (2006.01) |
| H01L 31/107 | (2006.01) |
| H01L 27/095 | (2006.01) |
| H01L 29/47 | (2006.01) |
| H01L 29/812 | (2006.01) |
| H01L 31/07 | (2012.01) |
| H01L 31/108 | (2006.01) |
| H01L 21/00 | (2006.01) |

(52) U.S. Cl. ........... 257/48; 257/127; 257/170; 257/409; 257/452; 257/458; 257/484; 257/490; 257/494; 257/495; 257/605; 257/618; 257/620; 257/E21.524; 257/E23.179; 438/462

(58) Field of Classification Search .................. 257/48, 257/458, 618, 620, E21.524, E23.179, 127, 257/170, 409, 452, 484, 490, 494, 495, 605; 438/462

See application file for complete search history.

(56) References Cited

U.S. PATENT DOCUMENTS

| | | | | |
|---|---|---|---|---|
| 4,849,313 | A * | 7/1989 | Chapman et al. | 430/5 |
| 6,403,448 | B1 * | 6/2002 | Reddy | 438/460 |
| 6,602,725 | B2 | 8/2003 | Sakai et al. | |
| 6,998,712 | B2 * | 2/2006 | Okada et al. | 257/758 |
| 7,053,453 | B2 * | 5/2006 | Tsao et al. | 257/374 |
| 7,129,565 | B2 * | 10/2006 | Watanabe et al. | 257/620 |

(Continued)

FOREIGN PATENT DOCUMENTS

JP        04-106950 A        4/1992

(Continued)

*Primary Examiner* — Ida M Soward
(74) *Attorney, Agent, or Firm* — Lee & Morse, P.C.

(57) ABSTRACT

A semiconductor wafer includes semiconductor chip areas on a semiconductor substrate, the semiconductor chip areas having thereon semiconductor circuit patterns and inner guard ring patterns surrounding the semiconductor circuit patterns; and scribe lanes on the semiconductor substrate between the semiconductor chip areas, the scribe lanes having thereon outer guard ring patterns surrounding the inner guard ring patterns and a process monitoring pattern between the outer guard ring patterns, the outer guard ring patterns and the process monitoring pattern being merged with each other.

13 Claims, 12 Drawing Sheets

U.S. PATENT DOCUMENTS

| | | | |
|---|---|---|---|
| 7,145,211 B2 * | 12/2006 | Mallikarjunaswamy et al. | 257/409 |
| 7,294,932 B2 * | 11/2007 | Hiroi | 257/758 |
| 7,394,137 B2 * | 7/2008 | Hayashi et al. | 257/409 |
| 7,417,304 B2 * | 8/2008 | Tsutsue | 257/620 |
| 7,453,128 B2 * | 11/2008 | Tsutsue et al. | 257/409 |
| 7,567,484 B2 * | 7/2009 | Ochi | 365/233.1 |
| 7,602,065 B2 * | 10/2009 | Hou et al. | 257/758 |
| 7,667,279 B2 * | 2/2010 | Nakashiba | 257/409 |
| 7,732,897 B2 * | 6/2010 | Jeng et al. | 257/620 |
| 7,759,173 B2 * | 7/2010 | DeVries et al. | 438/140 |
| 7,893,459 B2 * | 2/2011 | Wang et al. | 257/170 |
| 8,067,819 B2 * | 11/2011 | Yoshida et al. | 257/620 |
| 2002/0004932 A1 * | 1/2002 | Shau | 716/19 |
| 2002/0167071 A1 * | 11/2002 | Wang | 257/620 |
| 2005/0273749 A1 * | 12/2005 | Kirk | 716/16 |
| 2006/0261490 A1 * | 11/2006 | Su et al. | 257/775 |
| 2007/0190747 A1 * | 8/2007 | Humpston et al. | 438/460 |
| 2007/0194409 A1 * | 8/2007 | Wang et al. | 257/620 |
| 2009/0081566 A1 * | 3/2009 | Yang | 430/5 |
| 2011/0006794 A1 * | 1/2011 | Sellathamby et al. | 324/754.03 |

FOREIGN PATENT DOCUMENTS

| | | | |
|---|---|---|---|
| JP | 2006228865 A | * | 8/2006 |
| KR | 10-2008-0010667 A | | 1/2008 |

* cited by examiner

600a

I  GI  GO  MP

600b

I  GI  GO

SEMICONDUCTOR WAFER INCLUDING GUARD RING PATTERNS AND PROCESS MONITORING PATTERNS

BACKGROUND

1. Field

Example embodiments relate to technology capable of increasing the number of semiconductor chips per wafer.

2. Description of the Related Art

Several tens to several hundreds of semiconductor chips may be produced from a single wafer. That is, a plurality of circuit areas separated from each other by scribe lanes may be formed on a single wafer, so a plurality of semiconductor chips corresponding to the plurality of circuit areas may be obtained by processing the single wafer.

SUMMARY

Example embodiments of the inventive concept are directed to a semiconductor wafer, a semiconductor device, a semiconductor module, and an electronic apparatus including a guard ring pattern and a process monitoring pattern.

Example embodiments of the inventive concept provide a semiconductor wafer including semiconductor chip areas on a semiconductor substrate, the semiconductor chip areas having thereon semiconductor circuit patterns and inner guard ring patterns surrounding the semiconductor circuit patterns, and scribe lanes on the semiconductor substrate between the semiconductor chip areas, the scribe lanes having thereon outer guard ring patterns surrounding the inner guard ring patterns and a process monitoring pattern between the outer guard ring patterns, the outer guard ring patterns and the process monitoring pattern being merged with each other.

Example embodiments of the inventive concept provide a semiconductor wafer including semiconductor chip areas on a semiconductor substrate, the semiconductor chip areas having thereon semiconductor circuit patterns and inner guard ring patterns surrounding the semiconductor circuit patterns, and scribe lanes on the semiconductor substrate between the semiconductor chip areas, the scribe lanes having thereon outer guard ring patterns surrounding the inner guard ring patterns and a process monitoring pattern between the outer guard ring patterns, the outer guard ring patterns and the process monitoring pattern being merged with each other, wherein the semiconductor chip areas and the scribe lanes include a lower conductive layer extended in the inner guard ring patterns, the outer guard ring patterns, and the process monitoring pattern, an insulating layer on the lower conductive layer, the insulating layer extended in the inner guard ring patterns, the outer guard ring patterns, and the process monitoring pattern, a capping layer on the insulating layer, the capping layer including a denser insulting material than the insulating layer, the capping layer extended in the inner guard ring patterns, the outer guard ring patterns, and the process monitoring pattern, an upper conductive layer on the capping layer, the upper capping layer extended in the inner guard ring patterns, the outer guard ring patterns, and the process monitoring pattern, a first via pattern vertically penetrating the insulating layer, the first via pattern disposed between the lower conductive layer and the upper conductive layer in the outer guard ring patterns, and a second via pattern penetrating the insulating layer, the second via pattern disposed between the lower conductive layer and the upper conductive layer in the inner guard ring patterns.

Example embodiments of the inventive concept provide a semiconductor device, including a semiconductor chip area having a semiconductor circuit pattern, an inner guard ring pattern disposed outside of the semiconductor circuit pattern, an outer guard ring pattern disposed outside of the inner guard ring pattern, and a process monitoring pattern disposed outside of the outer guard ring pattern, wherein the outer guard ring pattern and the process monitoring pattern are merged with each other.

Example embodiments of the inventive concept provide a semiconductor device, including a semiconductor circuit pattern disposed in a semiconductor chip area, an inner guard ring pattern surrounding the semiconductor circuit pattern, an outer guard ring pattern surrounding the inner guarding area, and a process monitoring pattern surrounding the outer guard ring pattern, wherein the outer guard ring pattern and the process monitoring pattern are merged with each other.

Example embodiments of the inventive concept provide a semiconductor module including a module substrate, semiconductor devices disposed on the module substrate, and contact terminals disposed at the edge of the module substrate, wherein at least one of the semiconductor devices includes a semiconductor chip area having a semiconductor circuit pattern, an inner guard ring pattern disposed outside of the semiconductor circuit pattern, an outer guard ring pattern disposed outside of the inner guard ring pattern, and a process monitoring pattern disposed outside of the outer guard ring pattern, wherein the outer guard ring pattern and the process monitoring pattern are merged with each other.

Example embodiments of the inventive concept provide an electronic apparatus including a housing, a memory unit in the housing, the memory unit including a semiconductor device, an input/output unit, and a controller to control the memory unit and the input/output unit, wherein the semiconductor device includes a semiconductor chip area having a semiconductor circuit pattern, an inner guard ring pattern disposed outside of the semiconductor circuit pattern, an outer guard ring pattern disposed outside of the inner guard ring pattern, and a process monitoring pattern disposed outside of the outer guard ring pattern, wherein the outer guard ring pattern and the process monitoring pattern are merged with each other.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
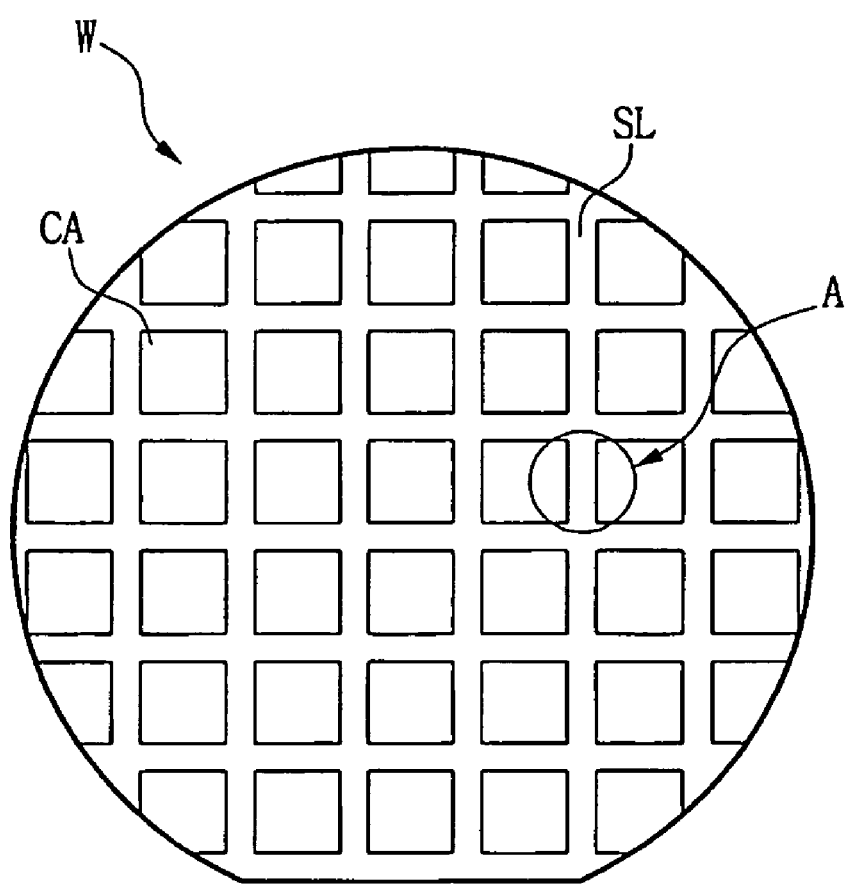
FIG. 1 illustrates a schematic plan view of a semiconductor wafer according to example embodiments.

Korean Patent Application No. 10-2008-0104952, filed on Oct. 24, 2008, in the Korean Intellectual Property Office, and entitled: "Semiconductor Wafer and Semiconductor Device Including Merged Guard Ring Patterns and Process Monitoring Pattern," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region and are not intended to limit the scope of the inventive concept.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will also be understood that when a layer is referred to as being "between" two layers, it can be the only layer between the two layers, or one or more intervening layers may also be present. Like reference numerals refer to like elements throughout.

According to example embodiments, an area occupied by a scribe lane on a wafer may be reduced by controlling various patterns formed on the scribe lane, so a total number of circuit areas on the wafer may be increased, i.e., a number of semiconductor chips processed on a single wafer may be increased. In particular, according to example embodiments, process monitoring patterns, i.e., patterns occupying relative large areas and used to monitor thickness of respective material layers, may be merged with other patterns, e.g., a guard ring pattern, to reduce a width of a scribe lane. It is noted that hereinafter "merging patterns" refers to physically connecting patterns in respective regions at a substantially same level, e.g., forming adjacent patterns on a substantially same surface without a space between the adjacent patterns. For example, patterns may be merged when two adjacent patterns are formed simultaneously in a single process and in contact, e.g., direct contact, with each other on a substantially same surface.

In contrast, conventional reduction in size of areas occupied by specific patterns on the scribe lane, e.g., an area occupied by the process monitoring patterns, may be insignificant because such a reduction in size may be limited within a very narrow range. For example, as the process monitoring patterns are used to measure thickness of layers deposited and patterned during a semiconductor manufacturing process, the dimensions of the process monitoring patterns depend on a highest resolution of a test apparatus and cannot be modified. Dimensions of other patterns formed on the scribe lane may be determined according to the resolutions of respective measuring apparatuses as well. Therefore, according to example embodiments, the process monitoring patterns may be merged with guard ring patterns. Specifically, an interval between semiconductor chips may be reduced by merging process monitoring patterns with other patterns, e.g., guard-ring patterns.

A semiconductor wafer and a semiconductor device according to example embodiments will now be described in detail with reference to the attached drawings. FIG. 1 illustrates a schematic plan view of a semiconductor wafer according to example embodiments.

Referring to FIG. 1, a semiconductor wafer W according to an example embodiment may include a plurality of semiconductor chip areas CA and scribe lanes SL disposed between the semiconductor chip areas CA. For example, as illustrated by the reference character "A" in FIG. 1, two adjacent semiconductor chip area CA may be separated from each by a scribe lane SL. Although a larger number of semiconductor chips CA than shown in FIG. 1 are formed on the semiconductor wafer W, for simplicity, only a small number of semiconductor chips CA are illustrated in FIG. 1. Also, the shapes and size ratios of the semiconductor chip areas CA and the scribe lanes SL are exaggerated for clarity.

Figure 2A:
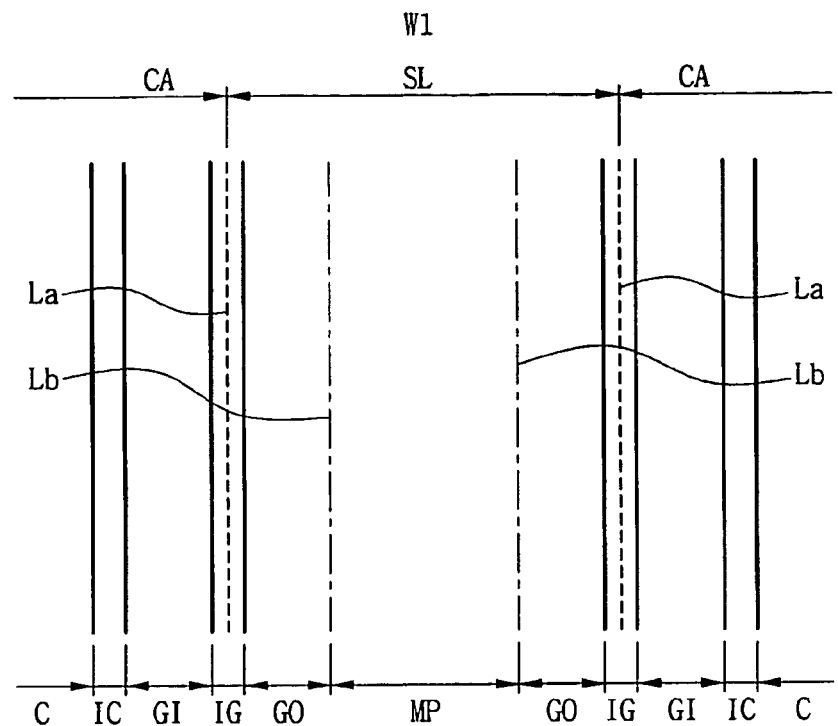
FIG. 2A illustrates an enlarged schematic plan view of region "A" in FIG. 1 according to example embodiments.

FIG. 2A illustrates an enlarged schematic plan view of region "A" in the semiconductor wafer W illustrated in FIG. 1. It is noted that FIG. 2A illustrates relative schematic arrangements in terms of distances between elements. Therefore, while FIG. 2A refers to a semiconductor wafer W1, the configuration illustrated in FIG. 2A may similarly refer to a corresponding semiconductor device formed on the semiconductor wafer W1.

Referring to FIG. 2A, portions of two semiconductor chip areas CA of the semiconductor wafer W1 are illustrated with the scribe lanes SL disposed therebetween. The semiconductor chip areas CA may include semiconductor circuits C and inner guard ring patterns GI. The scribe lane SL may include outer guard ring patterns GO and a process monitoring pattern MP. According to example embodiments, at least one of the outer guard ring patterns GO may be merged with the process monitoring pattern MP. In FIG. 2A, dotted lines La denote imaginary boundary lines between the semiconductor chip areas CA and the scribe lane SL, and dash-dotted lines Lb denote imaginary boundary lines between the outer guard ring patterns GO and the process monitoring pattern MP. It is noted that hereinafter that reference characters GI, GO, and MP may refer interchangeably to patterns defined above or to corresponding areas on the semiconductor wafer.

Each semiconductor chip area CA may include at least one semiconductor circuit C. One semiconductor circuit C or a plurality of semiconductor circuit C may be formed in any configuration in the semiconductor chip area CA, and at least one inner guard ring pattern GI may surround, e.g., completely surround, the semiconductor circuit C disposed in the semiconductor chip area CA. That is, the at least one inner guard ring pattern GI may be formed along a perimeter of the semiconductor chip area CA between the semiconductor circuit C in the semiconductor chip area CA and the scribe lane SL adjacent to the semiconductor chip area CA. As illustrated in FIG. 2A, the inner guard ring pattern GI may be adjacent to the scribe lanes SL. For example, the inner guard ring pattern GI may include a plurality of patterns formed along four sides of each of the semiconductor chip areas CA to surround a perimeter of each of the semiconductor chip areas CA. As illustrated in FIG. 2A, the real semiconductor circuit C may be spaced a predetermined distance IC apart from the inner guard ring pattern GI. It is noted that if the inner guard ring pattern GI surrounds the semiconductor circuit C, the predetermined distance IC may be uniform along an entire perimeter of the semiconductor circuit C.

As further illustrated in FIG. 2A, the outer guard ring patterns GO may be disposed in the scribe lane SL adjacent to the semiconductor chip areas CA. For example, each outer guard ring pattern GO may be adjacent to a respective inner guard ring pattern GI, and may surround a respective semiconductor circuit C. The outer guard ring patterns GO, as well as the inner guard ring patterns GI, may protect the semiconductor circuits C disposed in the semiconductor chip areas CA. For example, the inner and outer guard ring patterns GI and GO may protect the semiconductor circuits C from moisture, radiation, static electricity, and penetration of impurities. Also, the inner and outer guard ring patterns GI and GO may protect the semiconductor circuits C from stress factors, e.g., pressure and heat, applied during a test process.

The inner guard ring patterns GI and the outer guard ring patterns GO may be formed by a semiconductor chip manufacturing process, and may have a substantially same or similar shape as the semiconductor circuits C disposed in the semiconductor chip areas CA. The shapes of the inner and outer guard ring patterns GI and GO will be described in detail later. The inner guard ring patterns GI may be spaced a predetermined distance IG from the outer guard ring patterns GO. It is noted that if the inner and outer guard ring patterns GI surround the semiconductor circuits C, the predetermined distance IG may be uniform along an entire perimeter of the semiconductor circuits C.

As further illustrated in FIG. 2A, the process monitoring pattern MP may be disposed in the scribe lane SL between two adjacent outer guard ring patterns GO. That is, a single scribe lane SL between two adjacent semiconductor chip areas CA may include a process monitoring pattern MP between two guard ring patterns GO. The process monitoring pattern MP may be merged with the outer guard ring patterns GO. Merging the outer guard ring patterns GO with the process monitoring pattern MP refers to forming one pattern including the outer guard ring patterns GO and the process monitoring pattern MP instead of forming the outer guard ring patterns GO separately from the process monitoring pattern MP. For example, the process monitoring pattern MP and the outer guard ring patterns GO may be formed to contact each other, e.g., formed simultaneously and integrally as one pattern.

Merging the outer guard ring patterns GO with the process monitoring pattern MP according to example embodiments may reduce a width of the scribe lane SL. That is, boundary regions between the outer guard ring patterns GO and the process monitoring pattern MP may be removed to reduce the width of the scribe lane SL. For example, a total sum of widths of merged process monitoring pattern MP and two outer guard ring patterns GO may be substantially smaller than a total sum of widths of conventional separated process monitoring pattern and outer guard ring patterns. For example, a width of the scribe lane SL may substantially equal a sum of widths of one process monitoring pattern MP and two outer guard ring patterns GO.

Figure 2B:
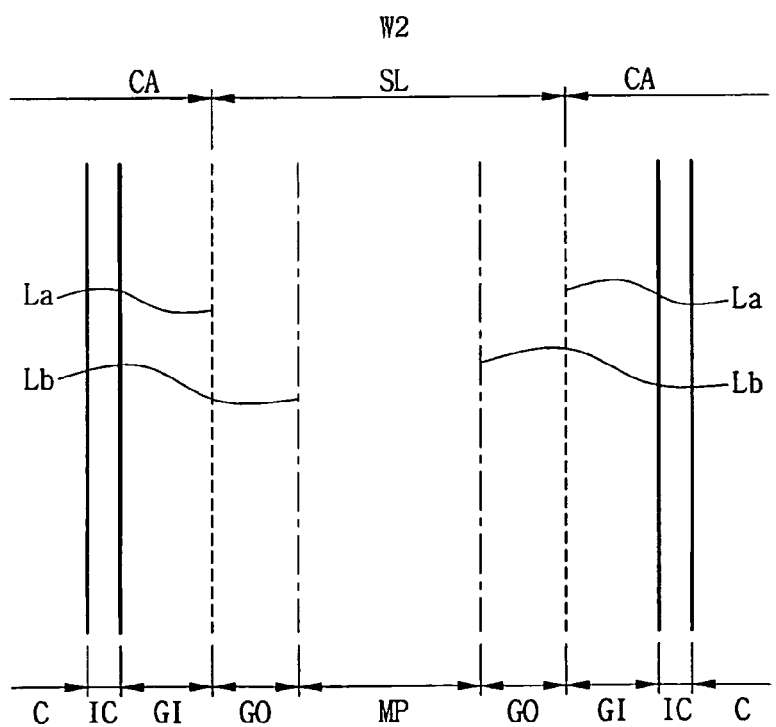
FIG. 2B illustrates an enlarged schematic plan view of region "A" in FIG. 1 according to another example embodiments.

FIG. 2B illustrates an enlarged schematic plan view of region "A" in the semiconductor wafer W illustrated in FIG. 1 according to another embodiment. It is noted that FIG. 2B illustrates relative schematic arrangements in terms of distances between elements. Therefore, while FIG. 2B refers to a semiconductor wafer W2, the configuration illustrated in FIG. 2B may similarly refer to a corresponding semiconductor device formed on the semiconductor wafer W2.

The embodiment illustrated in FIG. 2B may be substantially the same as the embodiment discussed previously with respect to FIG. 2A, with the exception of having the inner guard ring patterns GI, the outer guard ring patterns GO, and the process monitoring pattern MP merged with one another. When the inner and outer guard ring patterns GI and GO are merged, the predetermined space IG on each side of the scribe lane SL may be eliminated to further reduce the width of the scribe lane SL, e.g., as compared with the embodiment illustrated in FIG. 2A.

In particular, referring to FIG. 2B, the semiconductor wafer W2 may include semiconductor chip areas CA and a scribe lane SL. The semiconductor chip areas CA may include semiconductor circuits C and inner guard ring patterns GI. The scribe lane SL may include outer guard ring patterns GO and a process monitoring pattern MP. The inner guard ring patterns GI, the outer guard ring patterns GO, and the process monitoring pattern MP may be merged with one another. In FIG. 2B, dotted lines La denote imaginary boundary lines between the semiconductor chip areas CA and the scribe lane SL, and dash-dotted lines Lb denote imaginary boundary lines between the outer guard ring patterns GO and the process monitoring pattern MP. In the semiconductor wafer W2 according to the present example embodiment, since both the inner and outer guard ring patterns GI and GO are merged with the process monitoring pattern MP, the width of the scribe lane SL may be further reduced, e.g., as compared with the embodiment illustrated in FIG. 2A.

FIGS. 3A through 3I illustrate schematic cross-sectional views of steps in a process of forming a semiconductor device on a semiconductor wafer 100 according to an example embodiment.

Figure 3A:
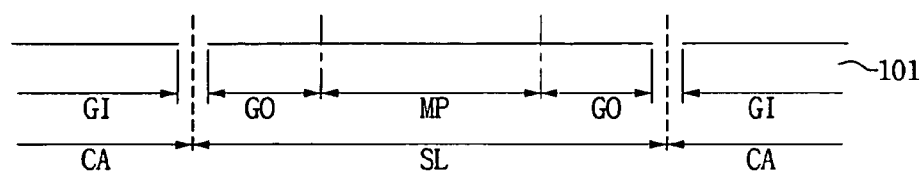
FIGS. 3A through 3I illustrate schematic cross-sectional views of steps in a process of forming a semiconductor device on a wafer according to an example embodiment.

Referring to FIG. 3A, the semiconductor wafer 100 may include a semiconductor substrate 101 with semiconductor chip areas CA and scribe lanes SL defined thereon. The semiconductor substrate 101 may include inner guard ring pattern areas GI, outer guard ring pattern areas GO, and process monitoring pattern MP. The inner guard ring pattern areas GI may be formed on the semiconductor chip areas CA, while the outer guard ring pattern areas GO and the process monitoring pattern MP may be formed on the scribe lane SL. In the scribe lane SL, the outer guard ring pattern areas GO may be merged, e.g., formed integrally, with the process monitoring pattern MP.

Figure 3B:
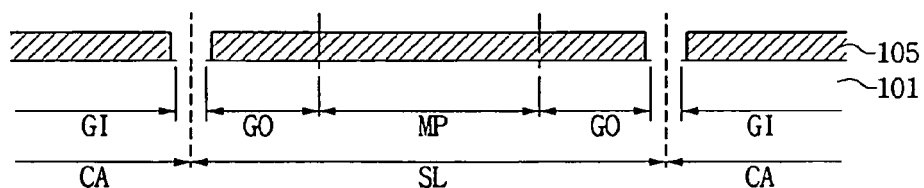

Referring to FIG. 3B, a first conductive layer 105, e.g., a layer including one or more of doped polycrystalline silicon (poly-Si), a metal silicide, a metal, and a metal compound, may be formed on the semiconductor chip areas CA and the scribe lane SL. The first conductive layer 105 may be a single- or multi-layered pattern formed directly on the semiconductor substrate 101. More specifically, the first conductive layer 105 may be formed during formation of a gate layer on the semiconductor chip areas CA. For example, the first conductive layer 105 may be formed at the same time as a gate insulating layer, a gate electrode layer, and a gate capping layer. Also, the gate electrode layer may have a multi-layered structure. Therefore, the first conductive layer 105 also may have a multi-layered structure. That is, the first conductive layer 105 may include upper and lower insulating material layers that may be formed during processes of forming the gate insulating layer and the gate capping layer, respectively. For simplicity, the first conductive layer 105 with a single-layered structure is shown in the drawings.

In the scribe lane SL, the first conductive layer 105 may be formed as a uniform pattern in the merged outer guard ring pattern areas GO and process monitoring pattern MP. For example, the first conductive layer 105 may be a common conductive layer to both the outer guard ring patterns and process monitoring patterns. According to the inventive concept, it can be inferred that the outer guard ring pattern areas GO and the process monitoring pattern MP may be formed in a common process. However, the inventive concept is not limited thereto.

Figure 3C:
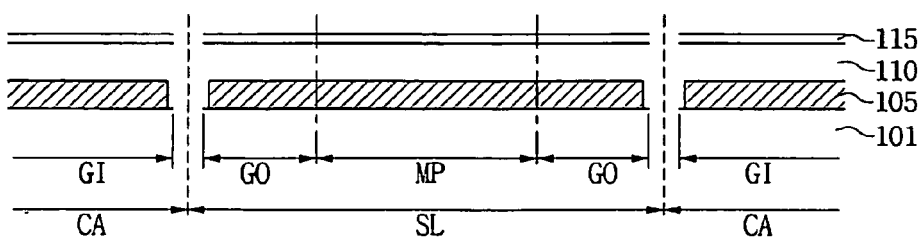

Referring to FIG. 3C, a first insulating layer 110 and a first capping layer 115 may be formed on the first conductive layer 105. The first insulating layer 110 and the first capping layer 115 may be insulating materials, e.g., one or more of silicon oxide, silicon nitride, and silicon oxynitride. For example, the first insulating layer 110 may be silicon oxide, and the first capping layer 115 may be a denser insulating material than the first insulating layer 110, e.g., silicon nitride and/or silicon oxynitride. In addition, each of the first insulating layer 110 and the first capping layer 115 may be an insulating layer entirely formed on the surface of the semiconductor substrate 101.

Figure 3D:
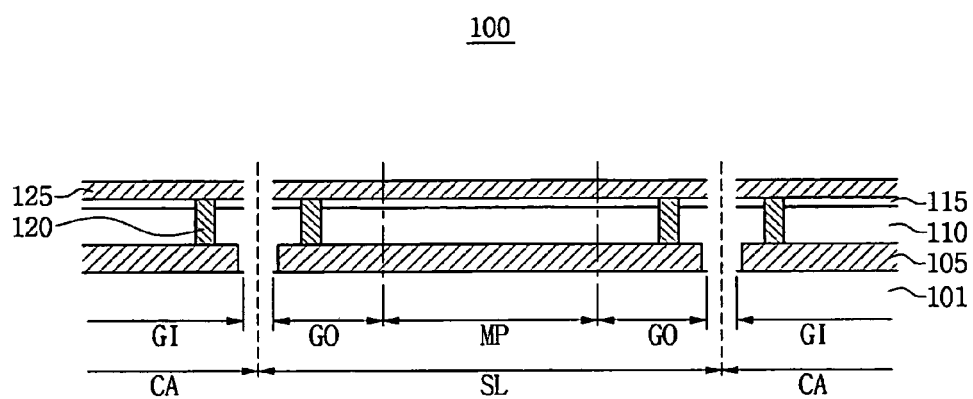

Referring to FIG. 3D, first via patterns 120 may be formed through the first insulating layer 110 and the first capping layer 115, and a second conductive layer 125 may be formed thereon. The first via patterns 120 and the second conductive layer 125 may be formed of conductive materials, e.g., one or more of doped polycrystalline silicon (poly-Si), a metal silicide, a metal, and a metal compound. The first via patterns 120 may be in contact with a top surface of the first conductive layer 105. Alternatively, the first via patterns 120 may be in contact, not with the first conductive layer 105, but with the semiconductor substrate 101. The first via patterns 105 may be formed during formation of contacts to be connected to the semiconductor substrate 101. The second conductive layer 125 may have the form of a planar plate or an interconnection line. The second conductive layer 125 may be formed during formation of interconnection lines, e.g., bit lines.

Figure 3E:
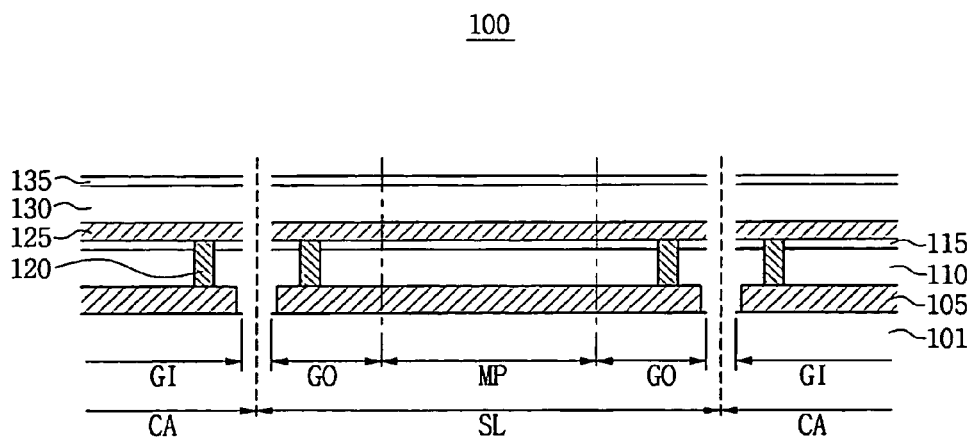

Referring to FIG. 3E, a second insulating layer 130 and a second capping layer 135 may be formed on the second conductive layer 125. The second insulating layer 130 may be silicon oxide and the second capping layer 135 may be a denser insulating material than the second insulating layer 130. In addition, the second insulating layer 130 and the second capping layer 135 may be entirely formed on the surface of the semiconductor substrate 101.

Figure 3F:
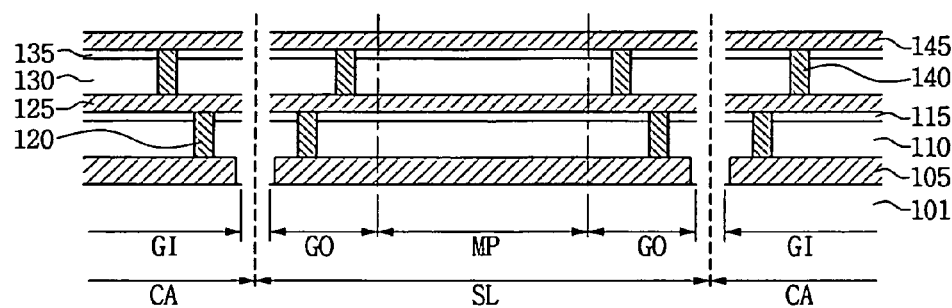

Referring to FIG. 3F, second via patterns 140 may be formed in the inner and outer guard ring pattern areas GI and GO through the second insulating layer 130 and the second capping layer 135, and a third conductive layer 145 may be formed thereon. The second via patterns 140 and the third conductive layer 145 may be conductive materials. The second via patterns 140 may be formed during formation of contacts having a higher level than a storage node contact or a bit line contact.

Figure 3G:
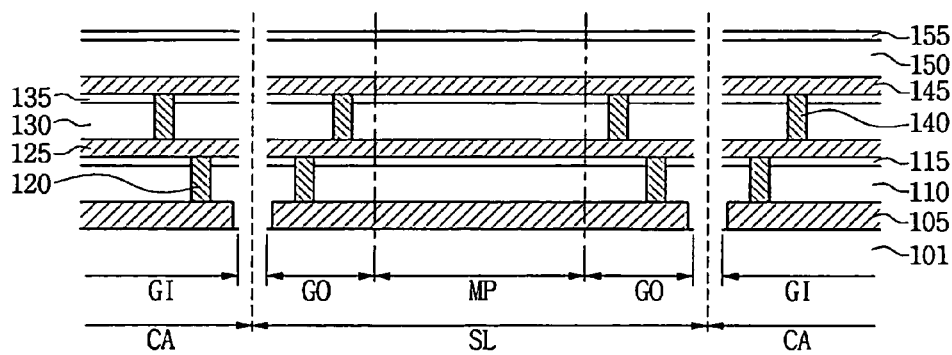

Referring to FIG. 3G, a third insulating layer 150 and a third capping layer 155 may be formed on the third conductive layer 145. The third insulating layer 150 may be silicon oxide, while the third capping layer 155 may be a denser insulating material than the third insulating layer 150.

Figure 3H:
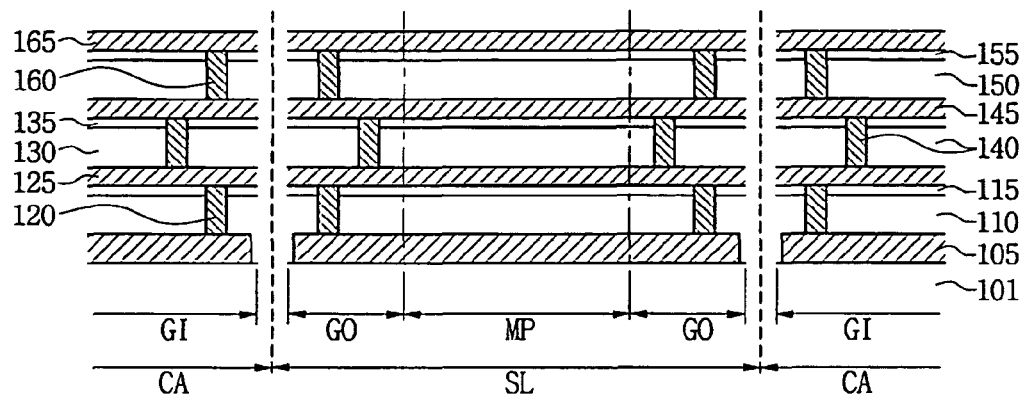

Referring to FIG. 3H, third via patterns 160 may be formed in the inner and outer guard ring pattern areas GI and GO through the third insulating layer 150 and the third capping layer 155, and a fourth conductive layer 165 may be formed thereon. The third via patterns 160 and the fourth conductive layer 165 may be conductive materials.

Figure 3I:
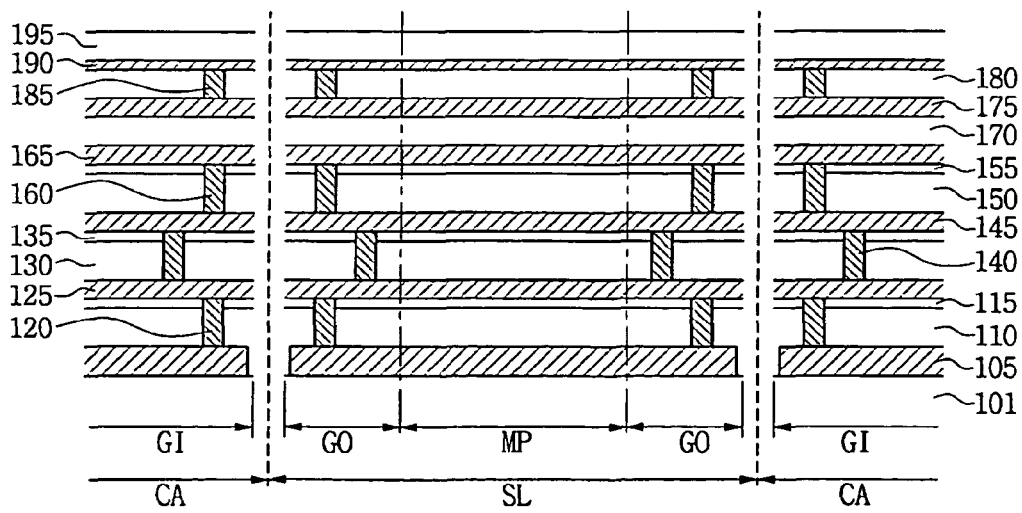

Referring to FIG. 3I, a fourth insulating layer 170, a fifth conductive layer 175, a fifth insulating layer 180, fourth via patterns 185, a sixth conductive layer 190, a sixth insulating layer 195, and various other material layers may be formed on the fourth conductive layer 165. In the example embodiment, the various material layers 170, 175, 180, 185, 190, and 195 do not refer to specific material layers. The material layers 170, 175, 180, 185, 190, and 195 in FIG. 3I may correspond to any suitable layers, e.g., planarization layers, layers used to fix the shapes of the underlying patterns, protection layers or passivation layers used to protect the underlying patterns from physical or chemical attacks, metal vias or metal interconnection lines and/or various other material layers. The material layers 170, 175, 180, 185, 190, and 195 may be changed according to the standards of respective semiconductor devices, and therefore, may be used in any suitable configuration and combination. As only a possibility of forming the various material layers 170, 175, 180, 185, 190, 195 is described herein, further descriptions of various metal vias will be omitted.

Figure 4A:
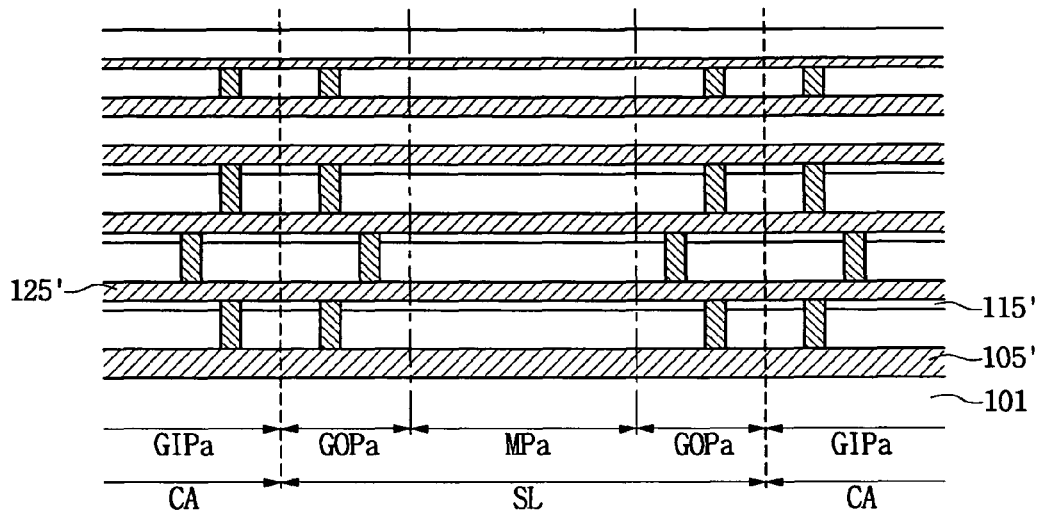
FIGS. 4A and 4B illustrate schematic cross-sectional views of semiconductor devices on wafers according to other example embodiments.
Figure 4B:
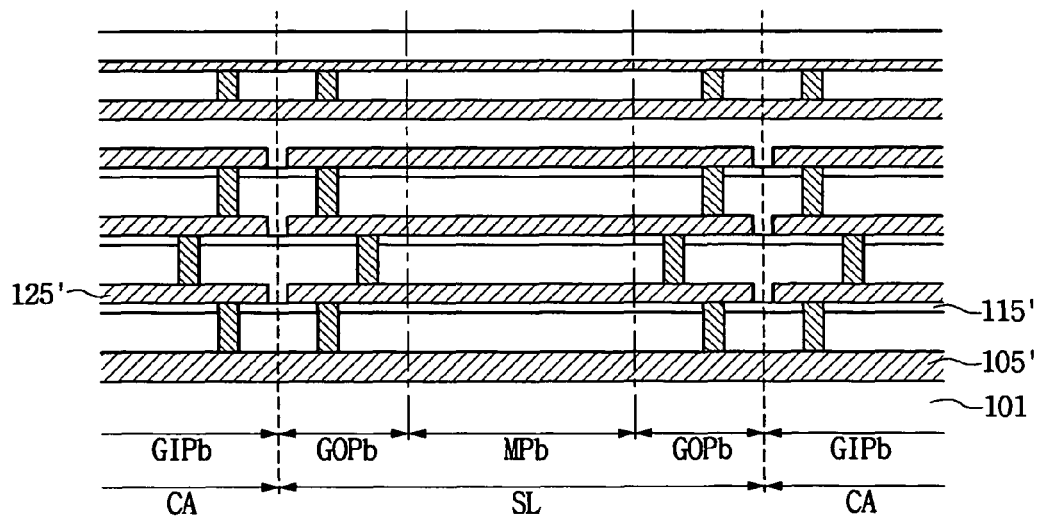

FIGS. 4A and 4B illustrate schematic, longitudinal cross-sectional views of a semiconductor device on a semiconductor wafer according to other example embodiment.

Referring to FIG. 4A, a semiconductor wafer 200a according to another example embodiment may include inner guard ring pattern areas GIPa, outer guard ring pattern areas GOPa, and a process monitoring pattern areas MPa, which are merged with one another. For example, as illustrated in FIG. 4A, the conductive and insulation layers of the semiconductor device on the semiconductor wafer 200a, e.g., conductive layers 105' and 125', as well as capping layer 115', may be formed continuously, e.g., simultaneously and as a single unit, to cover the inner guard ring pattern areas GIPa, outer guard ring pattern areas GOPa, and process monitoring pattern areas MPa.

Referring to FIG. 4B, a semiconductor wafer 200b according to still another example embodiment may include inner guard ring pattern areas GIPb, outer guard ring pattern areas GOPb, and a process monitoring pattern areas MPb, which are merged with one another. Also, conductive layers on the inner guard ring pattern areas GIPb may be electrically or physically insulated from conductive layers on the outer guard ring pattern areas GOPb. For example, as illustrated in FIG. 4B, while the conductive layer 105' may be continuous on the semiconductor substrate 101, the conductive layer 125' may have discrete patterns on the inner guard ring pattern areas GIPb that may be separated from corresponding portions of the conductive layer 125' on the outer guard ring pattern areas GOPb.

As illustrated in FIGS. 4A and 4B, the semiconductor wafers 200a and 200b and semiconductor devices thereon may not require an interval between the inner guard ring patterns GIPx and the outer guard ring patterns GOPx. Thus, the width of the scribe lane SL may be further reduced, and the number of semiconductor chips producible per wafer may be increased.

Some process operations may be excluded from processes of forming semiconductor wafers or semiconductor devices according to various example embodiments. For example, a conductive layer or a capping layer formed of an insulating material may be omitted according to the characteristic of each process operation. Each process operation may be omitted according to the intentions of one who wishes to realize the inventive concept. Since the inner and outer guard ring patterns do not need to operate as circuits, the inner and outer guard ring patterns do not need to configure a circuit. Accordingly, respective material layers may not involve a patterning process but have the form of planar plates or interconnection lines. Throughout the specification, a conductive material may include, e.g., doped polycrystalline silicon (poly-Si), a metal silicide, a metal, or a metal compound. Also, insulating materials may include, e.g., silicon oxide, silicon nitride, and silicon oxynitride. Capping layers may include one of silicon nitride or silicon oxynitride. In addition, the names and functions of components that are not denoted by reference numerals in some drawings will be easily understood from the other drawings and the description thereof.

Figure 5A:
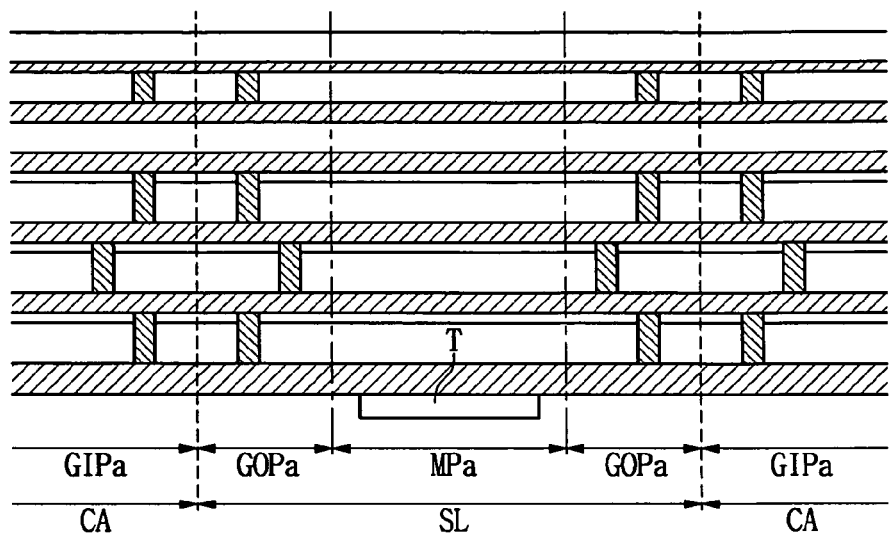
FIGS. 5A and 5B illustrate schematic cross-sectional views of semiconductor devices on wafers according to other example embodiments.
Figure 5B:
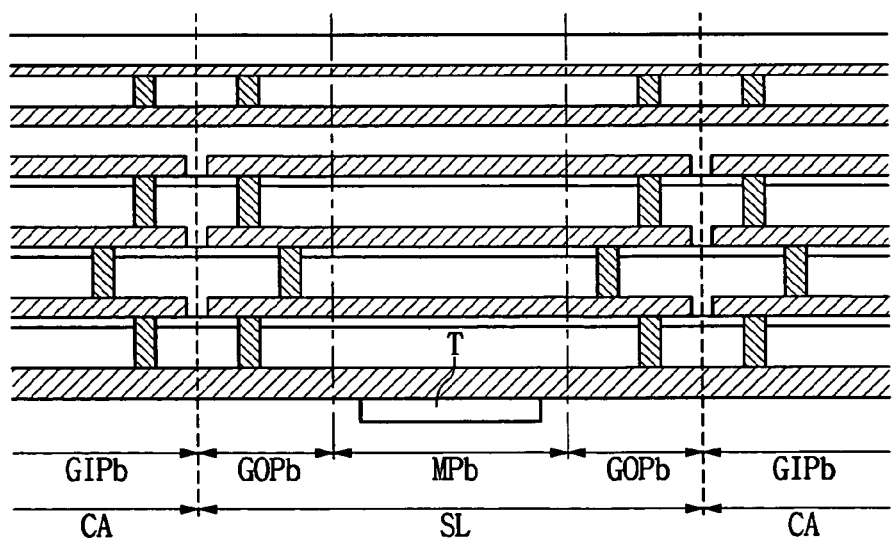

FIGS. 5A and 5B illustrate schematic cross-sectional views of semiconductor devices on wafers according to other example embodiments. Referring to FIG. 5A, a semiconductor wafer 300a may include inner guard ring pattern areas GIPa, outer guard ring pattern areas GOPa, and process monitoring pattern areas MPa having a trench T, which are merged with one another. The trench T may be formed in the semiconductor substrate. More particularly, the trench T may be formed in an upper portion of the semiconductor substrate. Further, the trench T may be filled with a silicon oxide. The trench T may be one of STIs (shallow trench isolations) and a monitoring pattern for monitoring an STI process.

Referring to FIG. 5B, a semiconductor wafer 300b according to another example embodiment may include inner guard ring pattern areas GIPb, outer guard ring pattern areas GOPb, and process monitoring pattern areas MPb having a trench T, which are merged with one another.

Figure 6A:
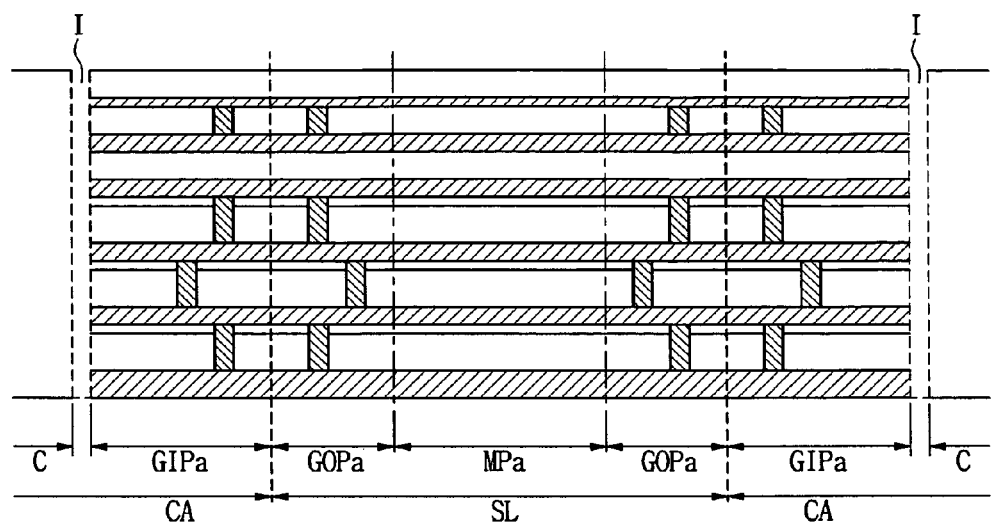
FIGS. 6A and 6B illustrate schematic cross-sectional views of semiconductor devices on wafers according to other example embodiments.
Figure 6B:
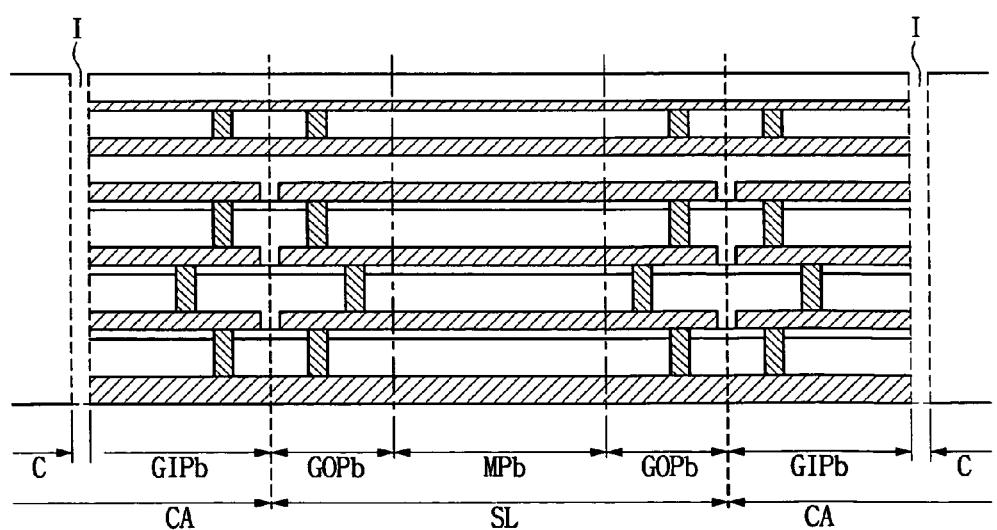

FIGS. 6A and 6B illustrate schematic cross-sectional views of semiconductor devices on wafers according to other example embodiments. Referring to FIGS. 6A and 6B, semiconductor wafers 400a and 400b include intervals I in the semiconductor chip areas CA. The intervals I may be disposed between the semiconductor circuits C and the inner guard ring patterns GIPa. The intervals I may mean that the semiconductor circuits C and the inner guard ring patterns GIPa are electrically disconnected from each other. Otherwise, the conductors of the semiconductor circuits C and the inner guard ring patterns GIPa are not electrically connected to each other.

Figure 7A:
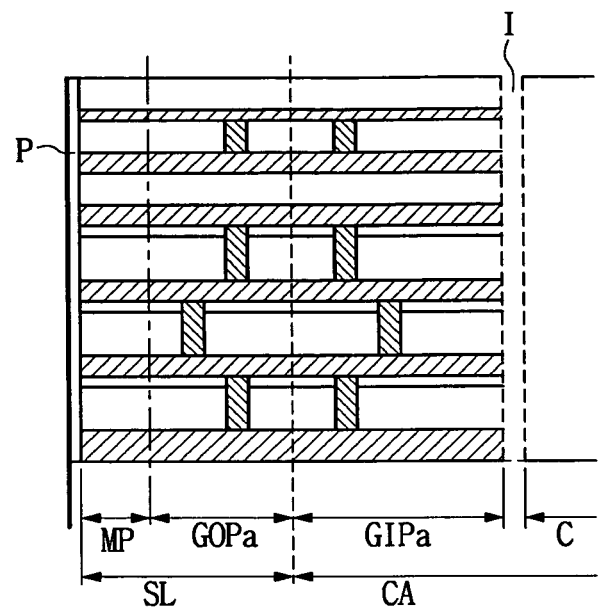
FIGS. 7A and 7B illustrate schematic cross-sectional views of semiconductor devices according to example embodiments.
Figure 7B:
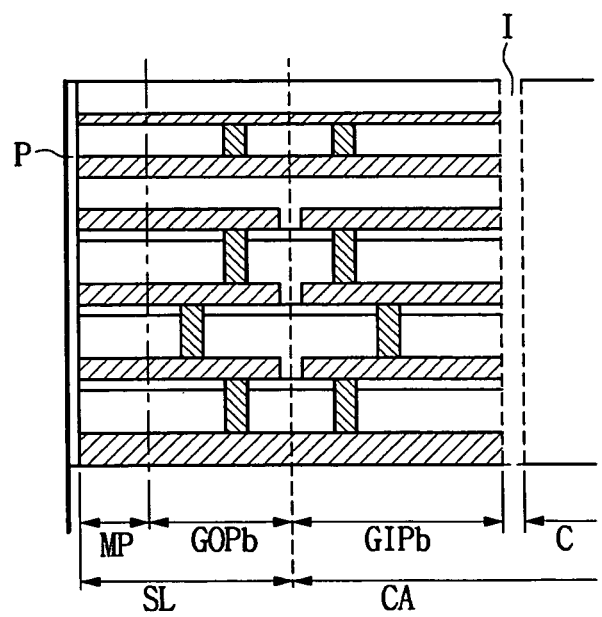
Figure 8A:
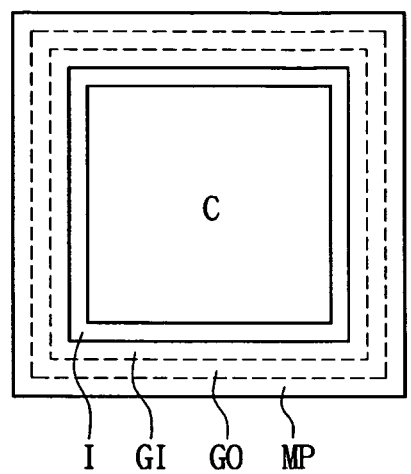
FIGS. 8A and 8B illustrate schematic plane views of semiconductor devices according to other example embodiments.
Figure 8B:
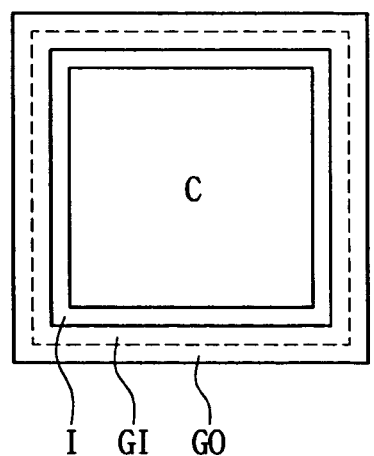

FIGS. 7A and 7B illustrate schematic cross-sectional views of semiconductor devices according to example embodiments. Referring to FIGS. 7A and 7B, semiconductor devices 500a and 500b may include passivation layers P on edges of the outer surfaces, which are separated surfaces from the semiconductor wafers using a sawing process. The semiconductor devices 500a and 500b may include a semiconductor circuit C, an inner guard ring pattern GiPa spaced from the semiconductor circuit C, an outer guard ring pattern GOPa adjacent to the inner guard ring pattern GIOa, and a portion of a monitoring pattern MP adjacent to the outer guard ring pattern GOPa, respectively. The passivation layers P may be a polyimide or resins including epoxy. More particularly, the process monitoring patterns MP may be not included in the semiconductor devices 500a and 500b. The process monitoring patterns MP may be whole or partially cut off from the semiconductors 500a and 500b during the sawing process. Furthermore, the outer guard ring patterns GOPa may be also not included in the semiconductor devices 500a and 500b. The outer guard ring patterns GOPa may be also whole or partially cut off from the semiconductors 500a and 500b during the sawing process. FIGS. 8A and 8B illustrate schematic plane views of semiconductor devices according to other example embodiments. Referring to FIG. 8A, the semiconductor device 600a may include a semiconductor circuit C, an inner guard ring pattern GI surrounding the semiconductor circuit C, an outer guard ring pattern GO surrounding the inner guard ring pattern GI, and a process monitoring pattern MP surrounding the outer guard ring pattern GO. The inner guard ring pattern GI may be spaced from the semiconductor circuit C by interval I. The outer guard ring pattern GI may be adjacent to the inner guard ring pattern GO and the process monitoring pattern MP may be adjacent to the outer guard ring pattern GO. The process monitoring pattern MP may be a rectangle shape because of the sawing process.

Referring to the FIG. 8B, the semiconductor device 600b may include a semiconductor circuit C, an inner guard ring pattern GI surrounding the semiconductor circuit C, and an outer guard ring pattern GO surrounding the inner guard ring pattern GI. A process monitoring pattern MP surrounding the outer guard ring pattern GO may be cut off from edges of the semiconductor device 600b by the sawing process.

Figure 9:
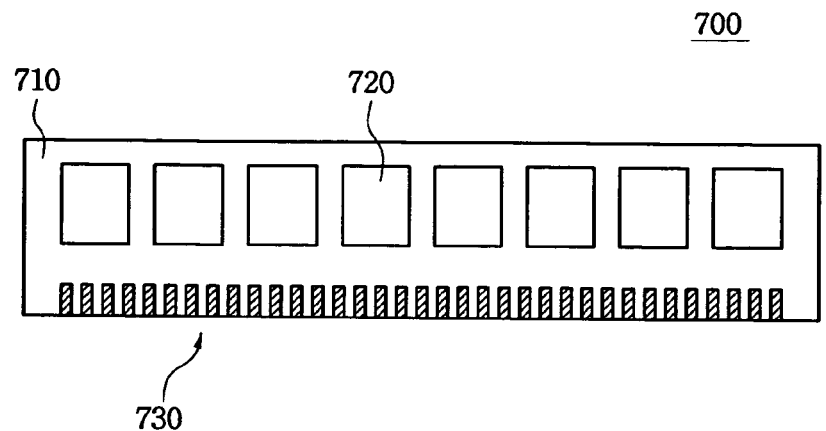
FIG. 9 illustrates a semiconductor module according to an embodiment of the present general inventive concept.

FIG. 9 illustrates a semiconductor module according to an embodiment of the present general inventive concept. Referring to FIG. 9, a semiconductor module 700 according to an embodiment of the present general inventive concept includes a module substrate 710, a plurality of semiconductor packages 720 disposed on the module substrate 710, and a plurality of contact terminals 730 formed at edge of the module substrate 710 and connected to the plurality of semiconductor packages 720, respectively. The module substrate 710 may be a printed circuit board. Both sides of the module substrate 710 may be used. In other words, the semiconductor devices may be disposed on both sides of the module substrate 710. One of the semiconductor packages 720 may be a control device to control the other semiconductor packages 720. Or, another semiconductor package to control the plurality of semiconductor packages 720 may be further disposed. At least one of the semiconductor packages 720 may include at least one of the semiconductor devices according to exemplary embodiments of the inventive concept. The contact terminals 730 may be formed of metals. The contact terminals 730 may be variously formed and/or disposed on the module substrate. Thus, the number of the contact terminals 730 does not have any specification. The semiconductor packages 720 may be interpreted by the semiconductor devices according to exemplary embodiments of the inventive concept.

Figure 10:
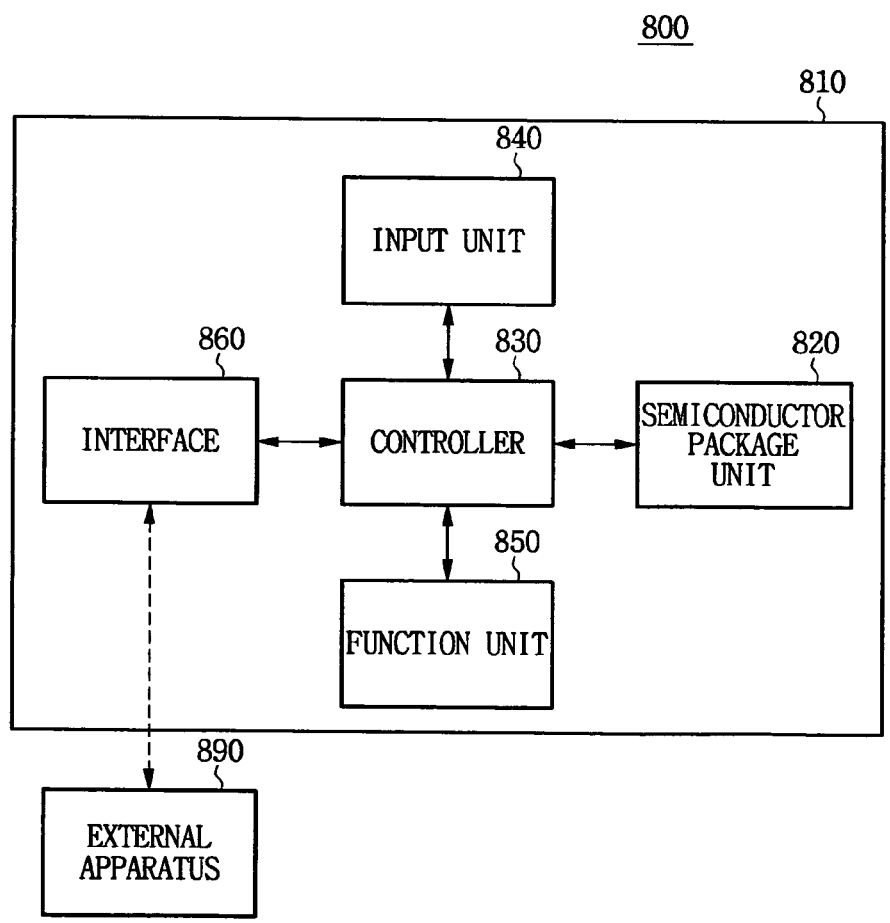
FIG. 10 illustrates a schematic view of an electronic apparatus according to example embodiments.

FIG. 10 is a block diagram illustrating an electronic apparatus 800 according to an embodiment of the present general inventive concept. The electronic apparatus 800 may include a housing 810 to accommodate elements or units of the electronic apparatus 800, a memory unit 820, a controller 830, an input/output unit 840, a function unit 850, and/or an interface unit 860 to communicate with an external apparatus 890 through a wired or wireless communication line to receive and transmit data or signals. At least one of the semiconductor devices and a semiconductor module illustrated in FIGS. 4A through 9 can be used as the memory unit 820. Therefore, the memory unit 820 can be referred to as the semiconductor devices or the semiconductor module. The data may be input through the input/output unit 840, the function unit 850, and/or the external apparatus 890 through the interface unit 860. The function unit 850 may be a unit to perform a function or operation of the electronic apparatus 800. For example, when the electronic apparatus 800 is an image processing apparatus, a television apparatus, or a monitor apparatus, the function unit 850 may be a display unit to display an image and/or an audio output unit to generate a signal or sound according to the data. When the electronic apparatus is a mobile phone, the function unit 850 may be a mobile phone function unit to perform a mobile phone function, for example, dialing, text messaging, photographing using a camera unit formed on the housing 810, audio and video data processing to be displayed on a display unit formed on the housing 810, etc. When the electronic apparatus is an image forming or scanning apparatus, the function unit 850 may be an image forming unit to feed a printing medium, to form or print an image on the printing medium, or to scan a document or picture to be stored in the memory unit. When the electronic apparatus 800 is a camera or camcorder, the function unit 850 may be a unit to photograph an image as a movie or a still image.

The controller 430 controls elements and units of the electronic apparatus 800 or may be a processor. At least one of the semiconductor devices and the semiconductor module 800 illustrated in FIGS. 4A through 9 can be included in the controller 830. Therefore, the controller 830 can be referred to as the semiconductor devices or the semiconductor module.

As described above, in a semiconductor wafer and semiconductor device according to example embodiments, an area occupied by a scribe lane may be reduced so that a larger number of semiconductor chips can be arranged on the semiconductor wafer, thereby improving semiconductor device manufacturing productivity. In particular, the process monitoring patterns may be merged with guard ring patterns, so an interval between semiconductor chips may be reduced. In contrast, when the process monitoring patterns are formed separately from the guard ring patterns, an oxide layer may be formed on entire surfaces of the process monitoring patterns, or no pattern may be formed. However, according to the inventive concept, several material layers may be stacked on the process monitoring patterns to enable stable patterning of the guard ring patterns. According to the inventive concept, merging patterns refers to physically connecting patterns formed in respective regions at the same level or simultaneously forming the patterns using a single process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor wafer, comprising:
    semiconductor chip areas on a semiconductor substrate, the semiconductor chip areas having thereon semiconductor circuit patterns and inner guard ring patterns surrounding the semiconductor circuit patterns; and
    scribe lanes on the semiconductor substrate between the semiconductor chip areas, the scribe lanes having thereon outer guard ring patterns surrounding the inner guard ring patterns and a process monitoring pattern between the outer guard ring patterns, the outer guard ring patterns and the process monitoring pattern being merged with each other,
    wherein the process monitoring pattern includes:
        a first lower conductive layer,
        a first insulating layer on the first lower conductive layer,
        a first capping layer on the first insulating layer, the first capping layer including a denser insulating material than the first insulating layer, and
        a first upper conductive layer on the first capping layer, and
    wherein the outer guard ring patterns include:
        a second lower conductive layer being made of and merged with the first lower conductive layer,
        a second insulating layer on the second lower conductive layer, the second insulating layer being made of and merged with the first insulating layer,
        a second capping layer on the second insulating layer, the second capping layer being made of and merged with the first capping layer, and
        a second upper conductive layer on the second capping layer, the second upper conductive layer being made of and merged with the first upper conductive layer.

2. The semiconductor wafer as claimed in claim 1, wherein the outer guard ring patterns further include:
    a first conductive via pattern vertically penetrating the second insulating layer and disposed between the second lower conductive layer and the second upper conductive layer.

3. The semiconductor wafer as claimed in claim 1, wherein the semiconductor circuit patterns and the inner guard ring pattern are spaced apart from each other.

4. The semiconductor wafer as claimed in claim 1, wherein a width of the scribe lane substantially equals a sum of widths of one process monitoring pattern and two outer guard ring patterns.

5. The semiconductor wafer as claimed in claim 1, wherein the inner guard ring patterns include:
    a third lower conductive layer being made of and merged with the second lower conductive layer;
    a third insulating layer on the third lower conductive layer, the third insulating layer being made of and merged with the second insulating layer;
    a third capping layer on the third insulating layer, the third capping layer being made of and merged with the second capping layer; and
    a third upper conductive layer on the third capping layer, the third upper conductive layer being made of and merged with the second upper conductive layer.

6. The semiconductor wafer as claimed in claim 5, wherein the inner guard ring patterns further include:
    a second conductive via pattern vertically penetrating the third insulating layer and disposed between the third lower conductive layer and the third upper conductive layer.

7. A semiconductor wafer, comprising:
    semiconductor chip areas on a semiconductor substrate, the semiconductor chip areas having thereon semiconductor circuit patterns and inner guard ring patterns surrounding the semiconductor circuit patterns; and
    scribe lanes on the semiconductor substrate between the semiconductor chip areas, the scribe lanes having thereon outer guard ring patterns surrounding the inner guard ring patterns and a process monitoring pattern between the outer guard ring patterns, the outer guard ring patterns and the process monitoring pattern being merged with each other,
    wherein the process monitoring pattern includes a trench in the semiconductor substrate and a silicon oxide filler filling the trench.

8. A semiconductor device, comprising:
    a semiconductor chip area having a semiconductor circuit pattern;
    an inner guard ring pattern disposed outside of the semiconductor circuit pattern;
    an outer guard ring pattern disposed outside of the inner guard ring pattern; and
    a process monitoring pattern disposed outside of the outer guard ring pattern, the outer guard ring pattern and the process monitoring pattern being merged with each other,
    wherein the process monitoring pattern includes:
        a first lower conductive layer,
        a first insulating layer on the first lower conductive layer, a first capping layer on the first insulating layer, the first capping layer including a denser insulating material than the first insulating layer, and a first upper conductive layer on the first capping layer, and wherein the outer guard ring pattern includes:

a second lower conductive layer being made of and merged with the first lower conductive layer, a second insulating layer on the second lower conductive layer, the second insulating layer being made of and merged with the first insulating layer, a second capping layer on the second insulating layer, the second capping layer being made of and merged with the first capping layer, and a second upper conductive layer on the second capping layer, the second upper conductive layer being made of and merged with the first upper conductive layer.

9. The semiconductor device as claimed in claim 8, wherein the inner guard ring pattern includes:

a third lower conductive layer being made of and merged with the second lower conductive layer;

a third insulating layer on the third lower conductive layer, the third insulating layer being made of and merged with the second insulating layer;

a third capping layer on the third insulating layer, the third capping layer being made of and merged with the second capping layer; and a third upper conductive layer on the third capping layer, the third upper conductive layer being made of and merged with the second upper conductive layer.

10. The semiconductor device as claimed in claim 8, wherein the semiconductor circuit pattern and the inner guard ring pattern are spaced apart from each other.

11. A semiconductor device, comprising:

a semiconductor circuit pattern disposed in a semiconductor chip area;

an inner guard ring pattern surrounding the semiconductor circuit pattern;

an outer guard ring pattern surrounding the inner guarding area; and a process monitoring pattern surrounding the outer guard ring pattern, the outer guard ring pattern and the process monitoring pattern being merged with each other, and the process monitoring pattern including a trench in the semiconductor substrate and a silicon oxide filler filling the trench.

12. The semiconductor device as claimed in claim 11, wherein the inner guard ring pattern and the outer guard ring pattern are merged with each other.

13. The semiconductor device as claimed in claim 11, wherein the semiconductor circuit pattern and the inner guard ring pattern are spaced apart from each other.

* * * * *